United States Patent
Fujii et al.

(10) Patent No.: US 9,406,882 B2
(45) Date of Patent: *Aug. 2, 2016

(54) NONVOLATILE RESISTANCE CHANGE ELEMENT

(75) Inventors: Shosuke Fujii, Fujisawa (JP); Hidenori Miyagawa, Yokohama (JP); Reika Ichihara, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 13/603,718

(22) Filed: Sep. 5, 2012

(65) Prior Publication Data

US 2013/0234097 A1 Sep. 12, 2013

(30) Foreign Application Priority Data

Feb. 8, 2012 (JP) .................................. 2012-025278

(51) Int. Cl.
 H01L 45/00 (2006.01)
 H01L 27/24 (2006.01)
(52) U.S. Cl.
 CPC ............ *H01L 45/145* (2013.01); *H01L 45/085* (2013.01); *H01L 45/1233* (2013.01); *H01L 45/1266* (2013.01); *H01L 45/148* (2013.01); *H01L 27/2472* (2013.01); *H01L 27/2481* (2013.01)
(58) Field of Classification Search
 None
 See application file for complete search history.

(56) References Cited

U.S. PATENT DOCUMENTS

| 8,569,728 | B2 | 10/2013 | Takano et al. | |
|---|---|---|---|---|
| 2009/0014707 | A1* | 1/2009 | Lu et al. | 257/4 |
| 2010/0006813 | A1* | 1/2010 | Xi et al. | 257/4 |
| 2010/0163826 | A1* | 7/2010 | Peters | 257/3 |
| 2010/0301301 | A1* | 12/2010 | Suda et al. | 257/2 |
| 2010/0314602 | A1 | 12/2010 | Takano et al. | |
| 2012/0074374 | A1 | 3/2012 | Jo | |

FOREIGN PATENT DOCUMENTS

JP 2010-287683 12/2010

OTHER PUBLICATIONS

Sung Hyun Jo et al., "CMOS Compatible Nanoscale Nonvolatile Resistance Switching Memory", Nano Letters, vol. 8, No. 2, 2008, pp. 392-397.
U.S. Appl. No. 14/022,732, filed Sep. 10, 2013, Ishikawa, et al.
U.S. Appl. No. 14/044,076, filed Oct. 22, 2013, Ichihara, et al.
Japanese Office Action issued Sep. 9, 2014, in Japanese Patent Application No. 2012-025278 filed Feb. 8, 2012 (with English translation).

* cited by examiner

*Primary Examiner* — Andres Munoz
(74) *Attorney, Agent, or Firm* — Oblon, McClelland, Maier & Neustadt, L.L.P

(57) ABSTRACT

According to one embodiment, a nonvolatile resistance change element includes a first electrode, a second electrode, a first layer and a second layer. The second electrode contains at least one metal element selected from Ag, Cu, Ni, Co, Al, and Ti. The first layer is arranged between the first electrode and the second electrode. The second layer is arranged between the first electrode and the first layer. A diffusion coefficient of the metal element in the second layer is larger than a diffusion coefficient of the metal element in the first layer.

10 Claims, 6 Drawing Sheets

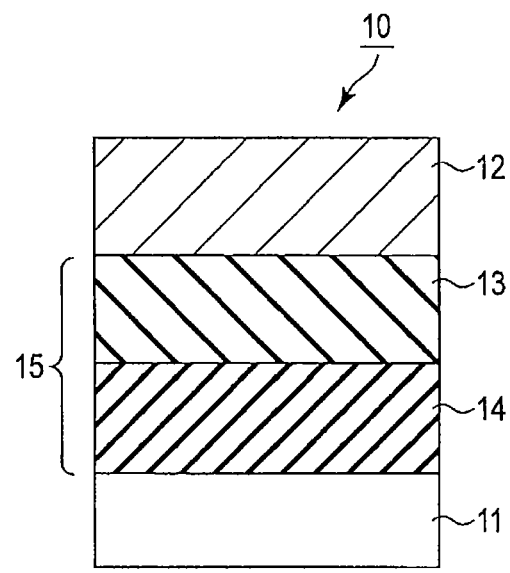
F I G. 1
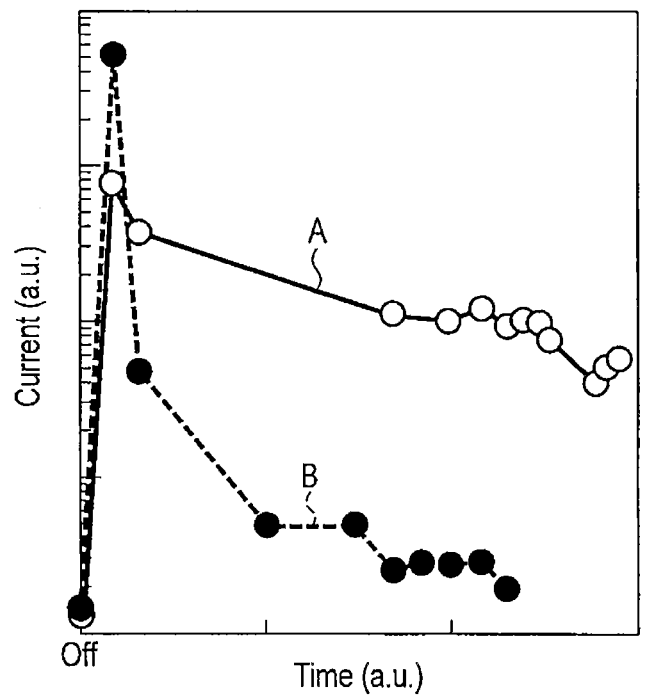
F I G. 2

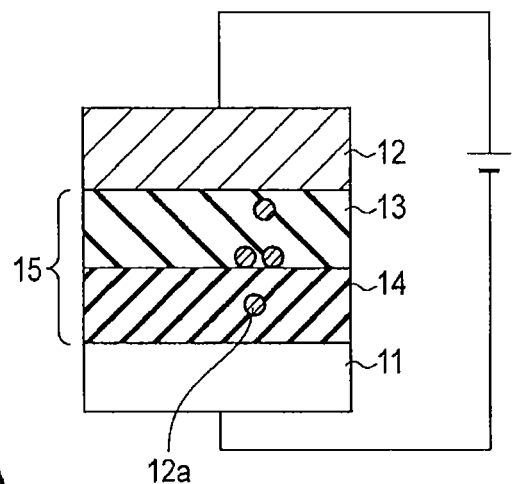
F I G. 3A
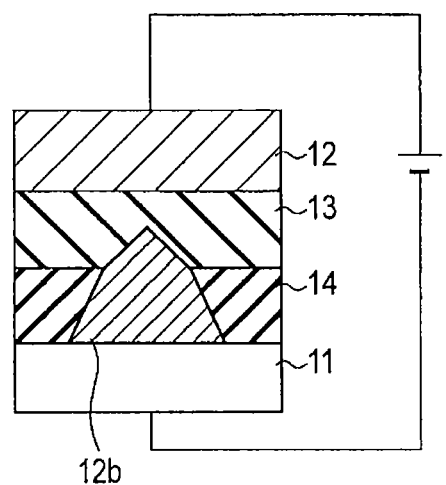
F I G. 3B
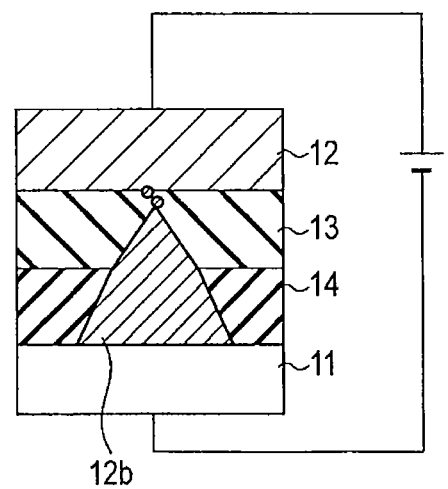
F I G. 3C

US 9,406,882 B2

NONVOLATILE RESISTANCE CHANGE ELEMENT

CROSS-REFERENCE TO RELATED APPLICATIONS

This application is based upon and claims the benefit of priority from Japanese Patent Application No. 2012-025278, filed Feb. 8, 2012, the entire contents of which are incorporated herein by reference.

FIELD

Embodiments described herein relate generally to a two-terminal nonvolatile resistance change element having a switching layer whose resistance value is electrically variable.

BACKGROUND

A NAND flash memory has widely spread as a memory device for mass data. At present, cost reduction or realization of a high capacity per bit has been advanced by miniaturizing a memory element.

However, to further miniaturize the flash memory, there are many problems to be solved, e.g., a short channel effect, inter-element interference, suppression of a variation of elements, and others. Therefore, as a new memory device which can substitute for a conventional floating gate type flash memory, a two-terminal nonvolatile resistance change element as typified by a resistive random access memory (ReRAM) has been developed. For example, a memory that uses amorphous silicon for a resistance change unit has a high switching probability but does not have excellent data retention characteristics.

BRIEF DESCRIPTION OF THE DRAWINGS

FIG. 1 is a cross-sectional view showing a configuration of a nonvolatile resistance change element according to a first embodiment;

FIG. 2 is a view showing retention characteristics in an ON state at the time of a read operation in the nonvolatile resistance change element according to the first embodiment;

FIGS. 3A, 3B, and 3C are cross-sectional views showing a mechanism that the retention characteristics in the ON state are improved in the nonvolatile resistance change element according to the first embodiment;

DETAILED DESCRIPTION

Figure 4A:
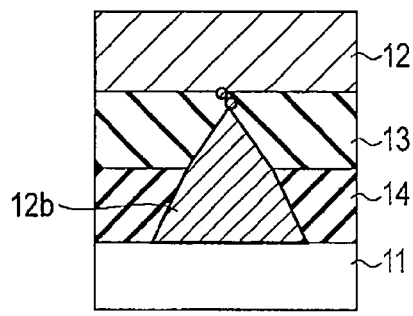
FIGS. 4A, 4B, 4C, and 4D are cross-sectional views showing diffusion of a metal filament in the nonvolatile resistance change element according to the first embodiment.
Figure 4B:
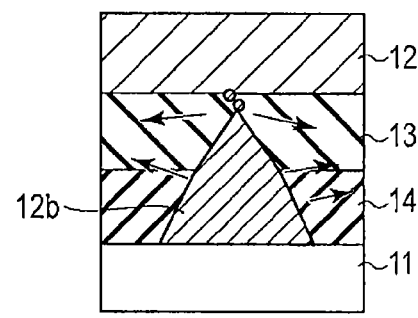
Figure 4C:
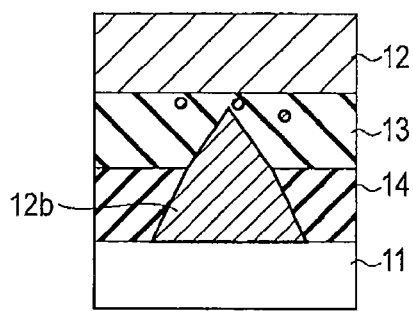

A nonvolatile resistance change element according to an embodiment will now be described hereinafter with reference to the drawings. It is to be noted that, in the following description, like reference numerals denote constituent elements having the same functions and structures, and an overlapping explanation will be given only when required.

In general, according to one embodiment, a nonvolatile resistance change element includes a first electrode, a second electrode, a first layer and a second layer. The second electrode contains at least one metal element selected from Ag, Cu, Ni, Co, Al, and Ti. The first layer is arranged between the first electrode and the second electrode. The second layer is arranged between the first electrode and the first layer. A diffusion coefficient of the metal element in the second layer is larger than a diffusion coefficient of the metal element in the first layer.

[First Embodiment]

FIG. 1 is a cross-sectional view showing a configuration of a nonvolatile resistance change element according to a first embodiment.

As shown in the drawing, a nonvolatile resistance change element 10 includes a lower electrode (a first electrode) 11, an upper electrode (a second electrode) 12, and a resistance change layer 15 that is arranged between the lower electrode 11 and the upper electrode 12. The resistance change layer 15 has a low-diffusion layer (a first layer) 13 and a high-diffusion layer (a second layer) 14. The low-diffusion layer 13 is arranged between the lower electrode 11 and the upper electrode 12. Further, the high-diffusion layer 14 is arranged between the lower electrode 11 and the low-diffusion layer 13.

The lower electrode 11 is formed of, e.g., a silicon (Si) layer having an impurity introduced therein. In more detail, the lower electrode 11 is formed of a high-concentration p-type silicon layer in which boron (B) is highly doped in such a manner that a resistivity becomes not greater than 0.005 Ωcm. The lower electrode 11 is not restricted to the above-described material. For example, an n-type silicon layer having arsenic (As) or phosphorus (P) doped therein may be used, or a conductive electrode made of a metal material such as Ti, W, or Ta, a carbide, or a nitride may be adopted. Furthermore, a conductive material containing a metal element such as Pt, Au, Ir, Ru, Rh, Pd, or Mo can be used for the lower electrode 11.

The upper electrode 12 is an electrode containing a metal element, and it is made of, e.g., Ag. It is to be noted that the upper electrode 12 is not restricted to Ag. For example, a conductive material containing any one of Ag, Cu, Ni, Co, Al, and Ti may be used. Moreover, a compound such as a nitride, a silicide, or a carbide of these elements may be used. Additionally, an alloy of these elements and any other metal element may be used.

The resistance change layer 15 has the high-diffusion layer 14 and the low-diffusion layer 13. The high-diffusion layer 14 is arranged on the lower electrode 11 side of the resistance change layer 15, and the low-diffusion layer 13 is arranged on the upper electrode 12 side of the same. The high-diffusion layer 14 is formed of, e.g., an amorphous silicon film or a polycrystalline silicon film. The low-diffusion layer 13 is formed of, e.g., a silicon oxide film. A diffusion coefficient of a metal element contained in the upper electrode 12 in the high-diffusion layer 14 is higher than a diffusion coefficient in the low-diffusion layer 13.

The resistance change element 10 having the above-described configuration includes the lower electrode 11, the upper electrode 12, and the resistance change layer 15 sandwiched between the lower electrode 11 and the upper electrode 12. Electric resistance of the resistance change layer 15 reversibly changes in accordance with a voltage that is applied between the lower electrode 11 and the upper electrode 12.

A manufacturing method of the nonvolatile resistance change element according to the first embodiment will now be described.

First, on a silicon semiconductor substrate, a silicon layer in which boron (B) is highly doped is deposited for approximately 20 nm by a CVD method. This silicon layer corresponds to the lower electrode 11. A film thickness of the lower electrode 11 is typically 5 to 200 nm.

Then, an amorphous silicon film is deposited on the silicon layer for approximately 10 nm by the CVD method. This amorphous silicon film corresponds to the high-diffusion layer 14. A film thickness of the amorphous silicon film is typically 5 to 50 nm.

A surface of the amorphous silicon film is oxidized by an oxygen plasma treatment so that a silicon oxide film is formed on the amorphous silicon film. This silicon oxide film corresponds to the low-diffusion layer 13. Thereafter, an Ag layer is deposited as the upper electrode 12 on the silicon oxide film. As a result, the resistance change element 10 shown in FIG. 1 is manufactured.

Then, retention characteristics in an ON state in the resistance change element 10 formed by the above manufacturing method will now be described with reference to FIG. 2.

FIG. 2 is a view showing retention characteristics in the ON state when a read voltage is applied to the resistance change element 10. In FIG. 2, an abscissa represents an elapsed time, and an ordinate represents a read current.

Characteristics indicated by A represent retention characteristics in the ON state in the first embodiment, and characteristics B indicated by B represent retention characteristics in the ON state in an element in which a resistance change layer is formed of an amorphous silicon film alone (which will be referred to as a comparative example hereinafter).

In the first embodiment, the resistance change layer 15 is not an amorphous silicon single layer, but it has a laminated configuration of the high-diffusion layer (an amorphous silicon film) 14 and the low-diffusion layer (a silicon oxide film) 13, and hence it can be understood that the retention characteristics in the ON state are improved. Here, the retention characteristics in the ON state mean how the read current in the ON state varies as time advances when a read voltage is applied to the resistance change element 10. In the first embodiment, the read current in the ON state is not greatly decreased with the passage of time, and it holds a sufficiently larger current value than a read current in an OFF state.

When the configuration of this embodiment is adopted, i.e., when the resistance change layer 15 between the lower electrode 11 and the upper electrode 12 has the laminated configuration of the high-diffusion layer 14 and the low-diffusion layer 13, the retention characteristics in the ON state are improved beyond the counterpart in the comparative example.

A mechanism that the retention characteristics in the on state are improved by the configuration of the resistance change element 10 according to the first embodiment will now be described with reference to FIGS. 3A, 3B, and 3C.

FIGS. 3A, 3B, and 3C are views showing the mechanism that the retention characteristics in the ON state are improved in the resistance charge element 10.

When a voltage that changes the upper electrode 12 to positive with respect to the lower electrode 11 is applied, a metal element contained in the upper electrode 11 is ionized, changed to metal ions 12a, and diffused in the resistance change layer 15 as shown in FIG. 3A. The metal ions 12a that have entered the resistance change layer 15 move to the lower electrode 11 side by an applied electric field.

When the metal ions 12a reach an interface between the lower electrode 11 and the resistance change layer 15, the metal ions 12a are reduced, a metal is precipitated, and a metal filament 12b is formed as shown in FIG. 3B. Additionally, as shown in FIG. 3C, when the metal filament 12b grows and the metal filament 12b connects the lower electrode 11 to the upper electrode 12, the ON state of the resistance change element 10 is realized.

Further, when a state that the lower electrode 11 is connected to the upper electrode 12 through the metal filament 12b is left as it is, a metal constituting the metal filament 12b diffuses, the metal filament 12b is gradually narrowed, and the metal filament 12b between the lower electrode 11 and the upper electrode 12 is disconnected at the end.

Therefore, the retention characteristics in the ON state in the resistance change element 10 are dependent on a diffusion speed of the metal constituting the metal filament 12b on the interface side of the resistance change layer 15 and the upper electrode 12 where the metal filament 12b is the narrowest. That is, the retention characteristics in the ON state of the resistance change element 10 can be improved by making a portion near the interface of the upper electrode 12 and the low-diffusion layer 13, namely, the low-diffusion layer 13, with use of a material which hardly causes diffusion of the metal ions.

Figure 4D:
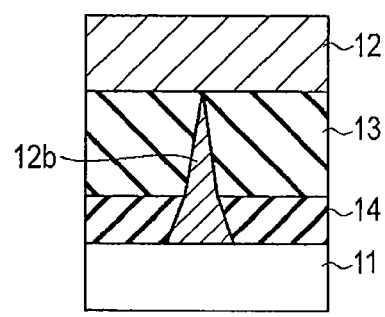

On the other hand, since the metal ions hardly diffuse in the low-diffusion layer 13, a forming speed of the metal filament 12b is slow. Therefore, when the low-diffusion layer 13 has an extremely large thickness, as shown in FIG. 4D, a diameter of the metal filament 12b formed in the vicinity of the interface of the upper electrode 12 is reduced, and the metal filament 12b is disconnected even if slight diffusion occurs. Therefore, there is an upper limit in the film thickness of the low-diffusion layer 13 for improving the retention characteristics in the ON state.

Figure 5:
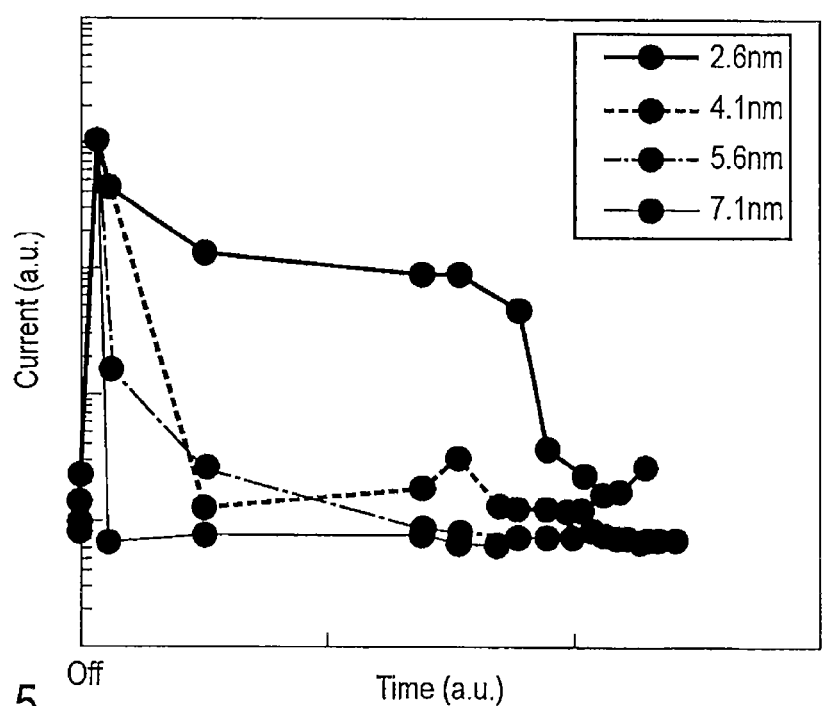
FIG. 5 is a view showing the retention characteristics in the ON state when a resistance change layer is a single low-diffusion layer in a nonvolatile resistance change element.

FIG. 5 shows the retention characteristics in the ON state when the resistance change layer 15 is the single low-diffusion layer in the resistance change element 10. In FIG. 5, an abscissa represents an elapsed time, and an ordinate represents a read current.

The low-diffusion layer 13 described herein is a silicon oxide film. FIG. 5 shows the retention characteristics in the ON state when a film thickness of the silicon oxide film is 2.6 nm, 4.1 nm, 5.6 nm, or 7.1 nm.

It is revealed from FIG. 5 that, when the film thickness of the low-diffusion layer 13 formed of the silicon oxide film is not greater than 4 nm, the resistance change element 10 has the excellent retention characteristics in the ON state.

On the other hand, the retention characteristics in the ON state are deteriorated as the film thickness of the silicon oxide film is increased. This can be explained based on the above-described mechanism. That is, since the metal ions hardly diffuse in the low-diffusion layer 13, the metal filament 12b to be formed is thin. Therefore, when the low-diffusion layer 13 is thick, a diameter of the metal filament in the vicinity of the interface of the upper electrode 12 is small, and the metal filament is disconnected by slight diffusion. As a result, the retention characteristics in the ON state in the resistance change element 10 are deteriorated.

Based on the above-described our research findings, when a film thickness of the low-diffusion layer is not greater than 4 nm, the diffusions of the metal ions can be suppressed while keeping a sufficiently large diameter of the metal filament, and the retention characteristics in the ON state can be improved. It is to be noted that the thickness of the low-diffusion layer 13 is more preferably 2.6 nm or below.

Figure 6:
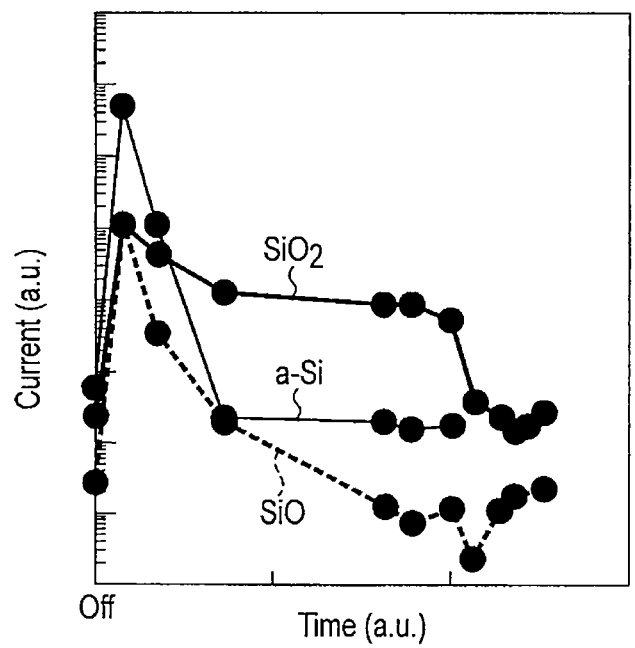
FIG. 6 is a view showing the retention characteristics in the ON state when the resistance change layer consists of amorphous silicon, SiO, or $SiO_2$ in a nonvolatile resistance change element.

FIG. 6 shows the retention characteristics in the ON state when the resistance change layer 15 is made of amorphous silicon, SiO, or $SiO_2$ in the resistance change element 10.

It can be understood from FIG. 6 that, as compared with the case that the resistance change layer 15 is made of amorphous silicon or SiO, the retention characteristics in the ON state are excellent when the resistance change layer 15 is made of $SiO_2$. Therefore, the optimum composition range of the silicon oxide film (SiOx) as the low-diffusion layer 13 is $1<x\leq2$, and $0\leq x\leq1$ is not suitable for the low-diffusion layer. It is to be noted that a composition ratio (x) of SiOx can be analyzed by, e.g., X-ray photoelectron spectroscopy (XPS), transmission electron microscopy-energy dispersive X-ray spectroscopy (TEM-EDX).

As described above, according to the first embodiment, the nonvolatile resistance change element having the good retention characteristics in the ON state can be realized. That is, the nonvolatile resistance change element having the excellent data retention characteristics can be provided.

[Second Embodiment]

Figure 7:
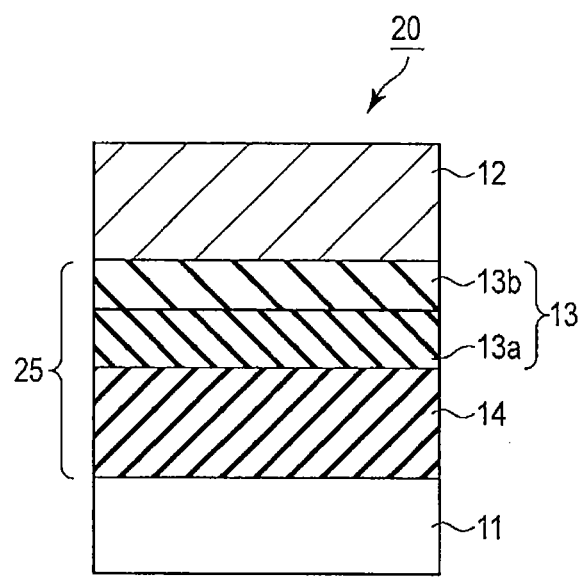
FIG. 7 is a cross-sectional view showing a configuration of a nonvolatile resistance change element according to a second embodiment.

FIG. 7 is a cross-sectional view showing a configuration of a nonvolatile resistance change element according to a second embodiment.

As shown in the drawing, a nonvolatile resistance change element 20 includes a lower electrode 11, an upper electrode 12, and a resistance change layer 25 arranged between the lower electrode 11 and the upper electrode 12. The resistance change layer 25 has a low-diffusion layer 13 and a high-diffusion layer 14. The low-diffusion layer 13 has a first low-diffusion layer 13a and a second low-diffusion layer 13b.

The first low-diffusion layer 13a is arranged between the lower electrode 11 and the upper electrode 12, and the second low-diffusion layer 13b is arranged between the first low-diffusion layer 13a and the upper electrode 12. Further, the high-diffusion layer 14 is arranged between the lower electrode 11 and the first low-diffusion layer 13a. That is, the high-diffusion layer 14, the first low-diffusion layer 13a, and the second low-diffusion layer 13b are sequentially formed from the lower electrode 11 side between the lower electrode 11 and the upper electrode 12.

The lower electrode 11 is made of, e.g., TiN. The upper electrode 12 is made of, e.g., Ag. It is to be noted that the upper electrode 12 is not restricted to Ag. For example, a conductive material containing any one of Ag, Cu, Ni, Co, Al, and Ti may be used. Moreover, a compound such as a nitride, a silicide, or a carbide of these elements may be used. Furthermore, an alloy of these elements and any other metal element may be used. The resistance change layer 25 is divided into three layers, and the high-diffusion layer 14, the first low-diffusion layer 13a, and the second low-diffusion layer 13b are laminated from the lower electrode 11 side in the mentioned order.

The high-diffusion layer 14 is made of, e.g., amorphous silicon. The first low-diffusion layer 13a is made of, e.g., $SiO_{1.5}$. Additionally, the second low-diffusion layer 13b is made of, e.g., $SiO_2$.

A composition ratio of silicon and oxygen in each layer constituting the resistance change layer 25 is not restricted to the above description. When both the first and second low-diffusion layers 13a and 13b are made of SiOx, $1<x\leq2$ enables improving retention characteristics in an ON state. This improvement is possible for the same reason as that described above in the first embodiment.

Further, to exert the mechanism described in conjunction with FIGS. 3A, 3B, and 3C, it is preferable for oxygen content in the second low-diffusion layer 13b to be higher than oxygen content in the first low-diffusion layer 13a. That is, when the first low-diffusion layer 13a is made of SiOy and the second low-diffusion layer 13b is made of SiOz, $y<z$ is preferable.

As described above, since a metal filament that realizes the ON state is the thinnest in the vicinity of the upper electrode 12, a diffusion speed of the metal filament in the second low-diffusion layer 13b near the upper electrode 12 is a factor that determines retention characteristics in the ON state. Therefore, it is preferable for a layer (the second low-diffusion layer 13b) that is in contact with the upper electrode 12 to be a layer having the lowest diffusion speed in the layers constituting the resistance change layer 25. Since the diffusion speed is reduced when the content of oxygen is high, the retention characteristics in the ON state can be improved based on $y<z$.

Furthermore, a total film thickness of the first low-diffusion layer 13a and the second low-diffusion layer 13b is set to be not greater than 4 nm. This value is set for the same reason as that described in the first embodiment with reference to FIG. 5.

As described above, according to the second embodiment, the nonvolatile resistance change element having the excellent retention characteristics in the ON state can be realized. That is, the nonvolatile resistance change element having the excellent data retention characteristics can be provided. Other structures and effects are the same as those in the first embodiment.

[Third Embodiment]

In a third embodiment, a description will be given as to a cross-point type resistance change memory in which the resistance change element according to the first or second embodiment is arranged at an intersecting portion of a bit line an a word line.

The first and second embodiments concern the technology of the memory cell alone, and they can be applied to any memory device without being dependent on a connection method of the memory cell. For example, the resistance change element according to each of the first and second embodiments can be applied to a so-called cross-point type memory cell array in which the resistance change element according to the first or second embodiment is inserted into an intersecting portion of a bit line and a word line as a memory device that can substitute for the NAND flash memory. Further, it can be also applied to a cross-point type three-dimensional laminated configuration.

Figure 8:
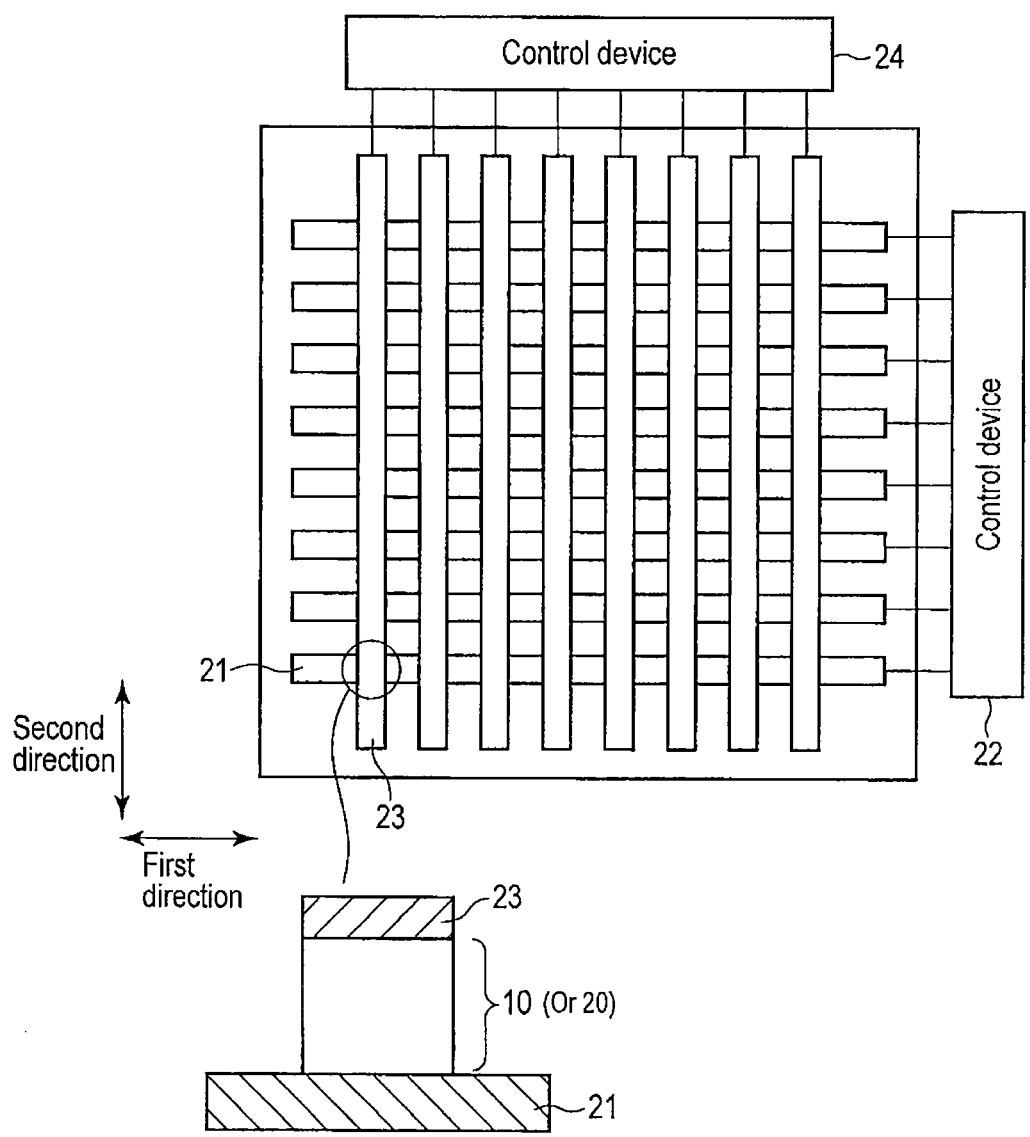
FIG. 8 is a view showing a memory cell array of a cross-point type memory according to a third embodiment.

FIG. 8 shows a memory cell array in a cross-point type memory according to the third embodiment. Word lines 21 extended in a first direction (a word line direction) are aligned in a second direction (a bit line direction), and a control circuit 22 that drives these word lines 21 is connected to the word lines 21. Bit lines 23 extended in the second direction are aligned in the first direction above the word lines 21, and a control circuit 24 that drive the bit lines 23 is connected to the bit lines 23.

A resistance change element 10 or 20 is arranged at an intersecting portion of the word line 21 and the bit line 23. The word line 21 includes a lower electrode 11, and the bit line 23 includes an upper electrode 12. Any other structures and effects are equal to those of the first and second embodiments.

As a modification of the third embodiment, a cross-point type three-dimensional laminated structure, which is a laminated cross-point type memory in which two resistance change elements 10 are laminated at an intersecting portion in this example, will now be described.

Figure 9A:
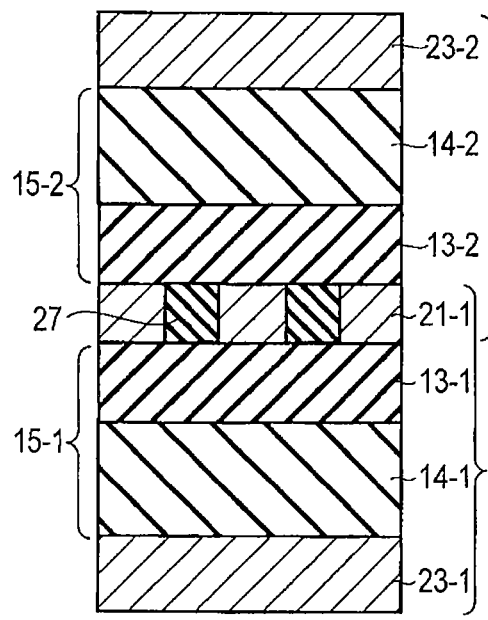
FIGS. 9A and 9B are cross-sectional views showing a configuration of a memory cell array in a laminated cross-point type memory according to a first modification.
Figure 9B:
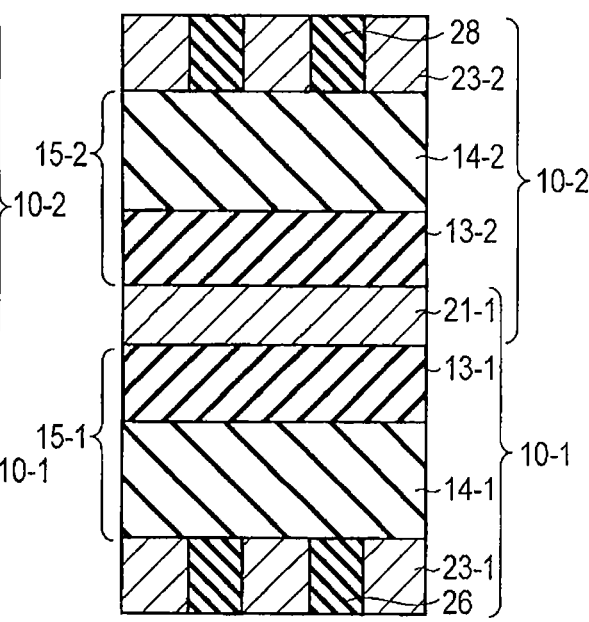

FIGS. 9A and 9B are cross-sectional views showing a configuration of a memory cell array of a laminated cross-point type memory according to the first modification. FIG. 9A shows a cross section along a bit line, and FIG. 9B shows a cross section along a word line.

In this first modification, a description will be given as to an example where resistance change layers 15-1 and 15-2 are not separated in accordance with each resistance change element (a memory cell) and they are formed as one laminated film in a memory cell array.

Each of bit lines 23-1 and 23-2 includes a lower electrode 11, and a word line 21-1 includes an upper electrode 12. As shown in FIG. 9A and FIG. 9B, nonvolatile resistance change elements 10-1 and 10-2 share the word line 21-1, and they are laminated in the vertical direction. These resistance change elements have a symmetrical configuration based on the word line 21-1. That is, the resistance change element 10-1 has the configuration shown in FIG. 1 (a sequentially laminated configuration), and the resistance change element 10-2 has a configuration (a reversely laminated configuration) reversed from the configuration depicted in FIG. 1.

The resistance change element 10-1 has the following configuration.

As shown in FIG. 9B, the bit lines 23-1 are aligned to be adjacent to each other. As shown in FIG. 9A, the word lines 21-1 are aligned to be adjacent to each other in such a manner that they cross the bit lines 23-1. Interlayer insulating films 26 are arranged between the bit lines 23-1, and interlayer insulating films 27 are arranged between the word lines 21-1.

The resistance change layer 15-1 is arranged between the bit lines 23-1 and the word lines 21-1. The resistance change layer 15-1 has a low-diffusion layer 13-1 and a high-diffusion layer 14-1. The high-diffusion layer 14-1 and the low-diffusion layer 13-1 are arranged sequentially from the bit-line 23-1 side between the bit lines 23-1 and the word lines 21-1. That is, the low-diffusion layer 13-1 is arranged between the bit lines 23-1 and the word lines 21-1. Furthermore, the high-diffusion layer 14-1 is arranged between the bit lines 23-1 and the low-diffusion layer 13-1.

The resistance change element 10-2 has the following configuration.

As shown in FIG. 9B, the bit lines 23-2 are aligned to be adjacent to each other. Interlayer insulating films 28 are arranged between the bit lines 23-2.

The resistance change layer 15-2 is arranged between the bit lines 23-2 and the word lines 21-1. The resistance change layer 15-2 has a low-diffusion layer 13-2 and a high-diffusion layer 14-2. The high-diffusion layer 14-2 and the low-diffusion layer 13-2 are arranged sequentially from the bit line 23-2 side between the bit lines 23-2 and the word lines 21-1. That is, the low-diffusion layer 13-2 is arranged between the bit lines 23-2 and the word lines 21-1. Moreover, the high-diffusion layer 14-2 is arranged between the bit lines 23-2 and the low-diffusion layer 13-2.

In the first modification, the resistance change layers 15-1 and 15-2 are not separated in accordance with each resistance change element, and they are formed as one laminated film, but each resistance change layer has a silicon oxide film, and hence high resistance in an oblique direction between the elements can be maintained. As a result, a leak current between the resistance change elements can be reduced. Further, since the resistance change layers do not have to be separated from each other, manufacture is easier than that of a later-described configuration that the resistance change layers are separated from each other.

A laminated cross-point type memory according to a second modification of the third embodiment will now be described.

Figure 10A:
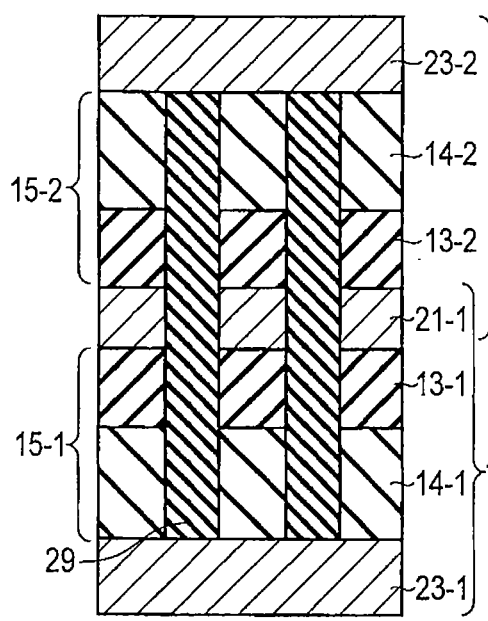
FIGS. 10A and 10B are cross-sectional views showing a configuration of a memory cell array in a laminated cross-point type memory according to a second modification.
Figure 10B:
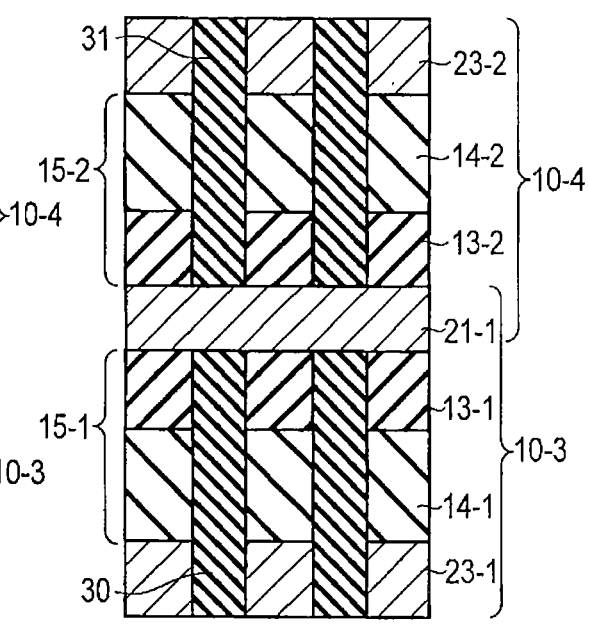

FIGS. 10A and 10B are cross-sectional views showing a configuration of a memory cell array in the laminated cross-point type memory according to the second modification. FIG. 10A shows a cross section taken along a bit line, and FIG. 10B shows a cross section taken along a word line.

In the first modification, the resistance change layers are not separated in accordance with each resistance change element, and they are formed as one laminated film. In this second modification, an example where the resistance change layers are separated in accordance with each resistance change element.

A resistance change element 10-3 has the following configuration.

In a cross section shown in FIG. 10A, separated resistance change layers 15-1 are arranged between bit lines 23-1 and word lines 21-1. Interlayer insulating films 29 are arranged between the resistance change layers 15-1 and the word lines 21-1.

Furthermore, in a cross section shown in FIG. 10B, the resistance change layers 15-1 are arranged between the bit lines 23-1 and the word lines 21-1. Interlayer insulating films 30 are arranged between the resistance change layers 15-1 and the bit lines 23-1.

A resistance change element 10-4 has the following configuration.

In the cross section shown in FIG. 10A, separated resistance change layers 15-2 are arranged between bit lines 23-2 and the word lines 21-1. The interlayer insulating films 29 are arranged between the resistance change layers 15-2.

Moreover, in the cross section shown in FIG. 10B, the resistance change layers 15-2 are arranged between the bit lines 23-2 and the word lines 21-1. Interlayer insulating films 31 are arranged between the resistance change layers 15-2 and the bit lines 23-2.

Configurations of the resistance change elements 10-3 and 10-4 are the same as those of the resistance change elements 10-1 and 10-2 except that the resistance change layers 15-1 and 15-2 are separated in accordance with each resistance change element.

In the second modification, since the interlayer insulating films are arranged between the resistance change elements adjacent to each other, an electrical leak does not occur between interconnection layers adjacent to each other through the resistance change layer. Therefore, the leak between the interconnection layers can be suppressed. Any other structures and effects are the same as those of the first and second embodiments.

Moreover, in the first and second modifications, since the low-diffusion layer is provided immediately above word lines in each of the resistance change elements 10-2 and 10-4, there is an advantage that a metal contained in the word lines hardly diffuses in each of the resistance change layers 15-2 and 15-4 during formation of each of the resistance change elements 10-2 and 10-4.

In both the first and second modifications, an element having a rectifying function may be interposed between the high-diffusion layer 14-1 (14-2) and the bit lines 23-1 (23-2) or between the low-diffusion layer 13-1 (13-2) and the word lines 21-1. The element having the rectifying function is, e.g., a PIN diode. When such a rectifying element is interposed, a sneak current that can be a noise component in a memory array operation can be suppressed, and reliability of the memory array operation can be improved.

Further, in the first and second modifications, although the description has been given as to the situation where each word line 21 includes the upper electrode 12 and each bit line 23 includes the lower electrode 11, as a matter of course, the upper electrode 12 and the lower electrode 11 may be formed separately from interconnection layers such as the word lines 21 and the bit lines 23. In this case, the upper electrode 12 is formed between the resistance change layer 15 and the word lines 21, and the lower electrode 11 is formed between the resistance change layer 15 and the bit lines 23.

As shown in FIGS. 8, 9A, 9B, 10A and 10B, an interconnection layer (of word lines and bit lines) has a rectangular shape and is formed in a single layer. However, the interconnection layer is not limited to what these Figures show. For example, the interconnection layer may be made of a plurality of materials or formed in a plurality of layers. In addition, a metal layer may be interposed between the interconnection layers (such as the word lines 21 and bit lines 23) and the resistance change element 10. In this case, the metal layer functions as part of the interconnection layer.

As described above, according to the third embodiment and the modifications thereof, it is possible to realize the cross-point type resistance change memory including the nonvolatile resistance change element having the excellent retention characteristics in the ON state. That is, the cross-point type resistance change memory including the nonvolatile resistance change element having the excellent data retention characteristics can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile resistance change element comprising:
   first and second interconnection layers which are adjacent to each other;
   third and fourth interconnection layers which are arranged to cross the first and second interconnection layers, adjacent to each other, and contain at least one metal element selected from Ag, Cu, Ni, Co, Al, and Ti;
   a first layer which is arranged between the first and second interconnection layers and the third and fourth interconnection layers, and contains silicon and oxygen, a thickness of the first layer being not greater than 4 nm;
   a second layer which is arranged between the first and second interconnection layers and the first layer, wherein the second layer includes at least one of amorphous silicon and polycrystalline silicon; and
   a third layer which is arranged between the first and second layers; wherein the third layer contains silicon and oxygen and has an oxygen concentration lower than an oxygen concentration of the first layer.

2. The nonvolatile resistance change element according to claim 1, wherein the first layer is formed of a silicon oxide film.

3. The nonvolatile resistance change element according to claim 1,
   wherein the first or second interconnection layer contains titanium nitride.

4. A nonvolatile resistance change element comprising:
   a first electrode;
   a second electrode which contains at least one metal element selected from Ag, Cu, Ni, Co, Al, and Ti;
   a first low diffusion layer and a second low diffusion layer arranged between the first electrode and the second electrode, each of which layers containing silicon and oxygen, the second low diffusion layer being closer to the second electrode than the first low diffusion layer and having an oxygen content higher than the oxygen content in the first low diffusion layer, the total thickness of the first and second low diffusion layers being not greater than 4 nm, and
   a high diffusion layer arranged between the first electrode and first low diffusion layer;
   wherein the high diffusion layer includes a east one of amorphous silicon and polycrystalline silicon.

5. The nonvolatile resistance change element according to claim 4,
   wherein the silicon and oxygen of the first low diffusion layer are present as $SiO_y$ and the silicon and oxygen of the second low diffusion layer are present as $SiO_z$, wherein z is greater than y.

6. The nonvolatile resistance change element according to claim 4,
   wherein the first electrode contains silicon.

7. The nonvolatile resistance change element according to claim 4,
   wherein the first electrode contains at least one of Ti, W, and Ta.

8. The nonvolatile resistance change element according to claim 4,
   wherein the first electrode contains at least one of Pt, Au, Ir, Ru, Rh, Pd, and Mo.

9. The nonvolatile resistance change element according to claim 4,
   wherein the first electrode contains titanium nitride.

10. The nonvolatile resistance change element according to claim 4, wherein said first and second low diffusion layers, and high diffusion layer, are the only layers between said first electrode and said second electrode.

* * * * *